(12) United States Patent
Kodama et al.

(10) Patent No.: US 8,809,072 B2
(45) Date of Patent: Aug. 19, 2014

(54) SUB-RESOLUTION ASSIST FEATURE ARRANGING METHOD AND COMPUTER PROGRAM PRODUCT AND MANUFACTURING METHOD OF SEMICONDUCTOR DEVICE

(75) Inventors: Chikaaki Kodama, Kanagawa (JP); Toshiya Kotani, Tokyo (JP); Shigeki Nojima, Kanagawa (JP); Shoji Mimotogi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 559 days.

(21) Appl. No.: 13/051,961

(22) Filed: Mar. 18, 2011

(65) Prior Publication Data

US 2011/0294239 A1 Dec. 1, 2011

(30) Foreign Application Priority Data

May 28, 2010 (JP) ................................. 2010-123100

(51) Int. Cl.
*H01L 21/66* (2006.01)
*G01R 31/26* (2014.01)

(52) U.S. Cl.
USPC ............................................... 438/7; 438/14

(58) Field of Classification Search
CPC .......... G03F 1/36; G03F 1/44; G06F 17/5068; G06F 2217/12
USPC ........... 438/14, 16, 17, 18; 716/50, 51, 52, 53
See application file for complete search history.

(56) References Cited

U.S. PATENT DOCUMENTS

| | | | |
|---|---|---|---|
| 6,964,032 B2 | 11/2005 | Liebmann et al. | |
| 7,506,299 B2 | 3/2009 | Socha et al. | |
| 2004/0170905 A1* | 9/2004 | Liebmann et al. | ................ 430/5 |
| 2005/0216875 A1* | 9/2005 | Zhang et al. | ..................... 716/9 |
| 2010/0021825 A1 | 1/2010 | Kodama et al. | |
| 2011/0029937 A1 | 2/2011 | Kodera et al. | |
| 2011/0029938 A1 | 2/2011 | Nojima et al. | |

FOREIGN PATENT DOCUMENTS

| | | |
|---|---|---|
| JP | 09-319067 | 12/1997 |
| JP | 2004-221594 | 8/2004 |
| JP | 2005-183981 | 7/2005 |
| JP | 2005-338650 | 12/2005 |

(Continued)

OTHER PUBLICATIONS

Kodera et al., "Mask-Layout Creating Method, Apparatus Therefor, and Computer Program Product," U.S. Appl. No. 13/028,525, filed Feb. 16, 2011.

(Continued)

*Primary Examiner* — Jae Lee
*Assistant Examiner* — Quovaunda V Jefferson
(74) *Attorney, Agent, or Firm* — Finnegan, Henderson, Farabow, Garrett & Dunner, L.L.P.

(57) ABSTRACT

According to a sub-resolution assist feature arranging method in embodiments, it is selected which of a rule base and a model base is set for which pattern region on pattern data corresponding to a main pattern as a type of the method of arranging the sub-resolution assist feature for improving resolution of the main pattern formed on a substrate. Then, the sub-resolution assist feature by the rule base is arranged in a pattern region set as the rule base and the sub-resolution assist feature by the model base is arranged in a pattern region set as the model base.

18 Claims, 9 Drawing Sheets

(56) References Cited

FOREIGN PATENT DOCUMENTS

| | | |
|---|---|---|
| JP | 2006-309039 | 11/2006 |
| JP | 2008-191364 | 8/2008 |
| JP | 2010-016044 | 1/2010 |

OTHER PUBLICATIONS

Notice of Rejection, issued by Japanese Patent Office, mailed Sep. 3, 2013, in a Japanese counterpart application No. 2010-123100 (5 pages including translation).

* cited by examiner

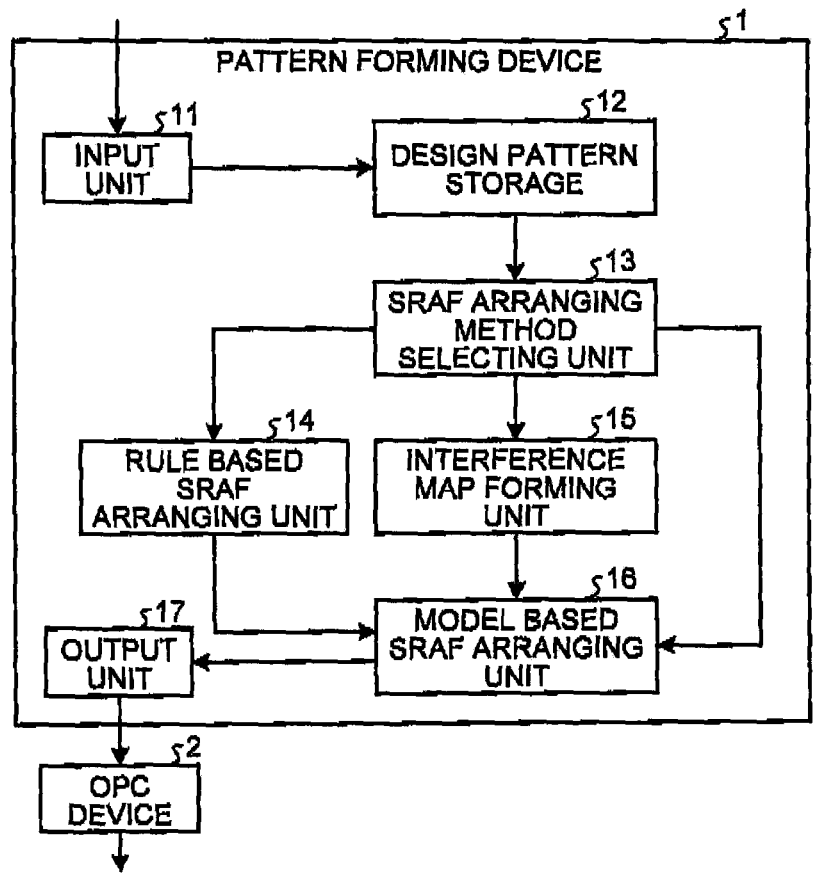
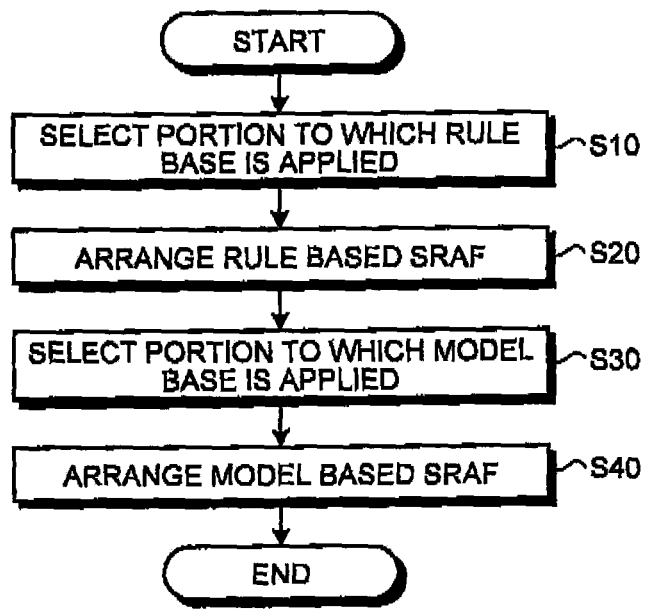

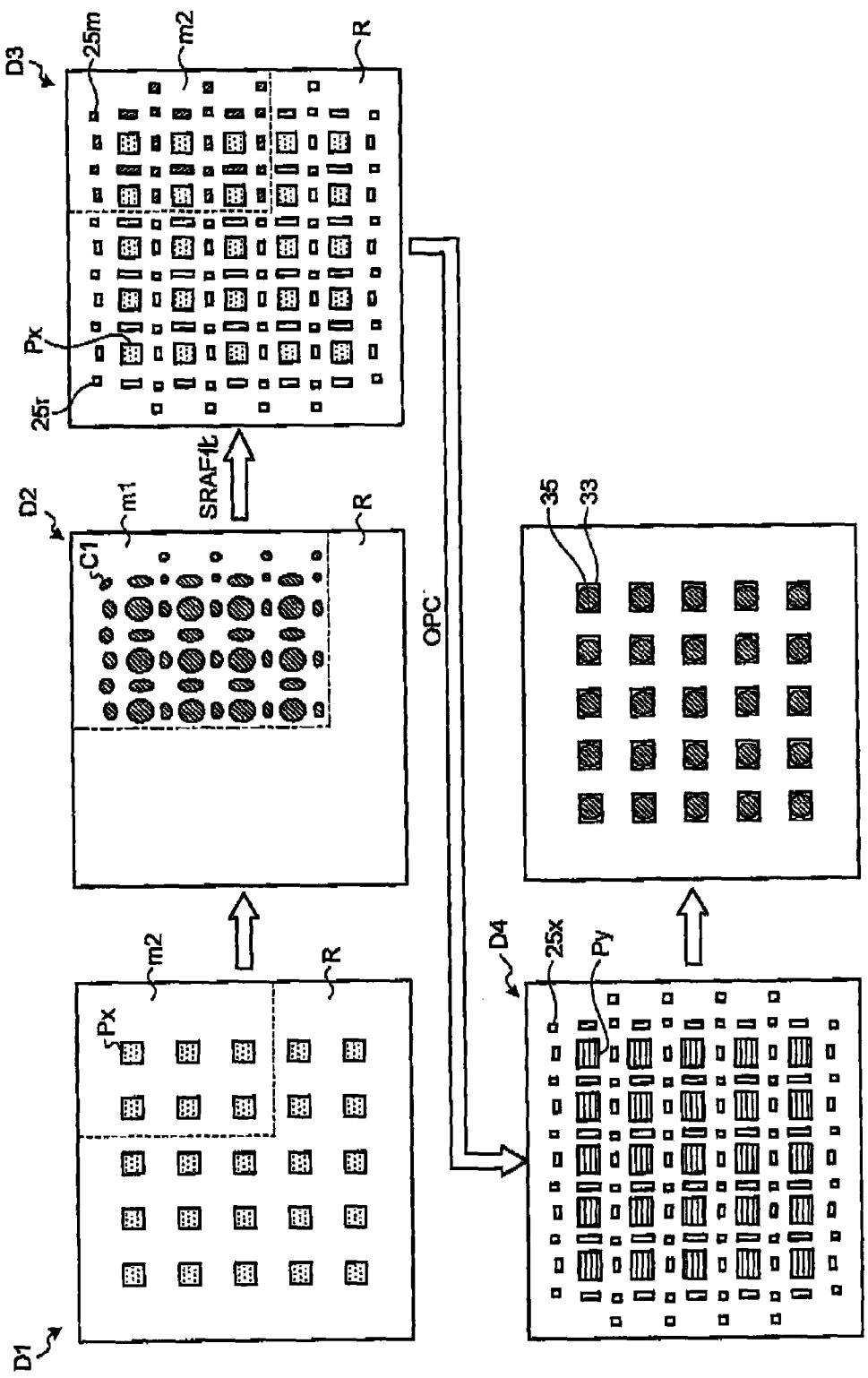

SUB-RESOLUTION ASSIST FEATURE ARRANGING METHOD AND COMPUTER PROGRAM PRODUCT AND MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2010-123100, filed on May 28, 2010; the entire contents of which are incorporated herein by reference.

FIELD

Embodiments generally relate to a sub-resolution assist feature arranging method and a computer program product and a manufacturing method of semiconductor device

BACKGROUND

Conventionally, there is layout design using a sub-resolution assist feature (SRAF) as a method of improving a lithography margin of an exposure pattern (main pattern) in a semiconductor lithography technology.

As a method of arranging such SRAF, there are two technologies, which are a rule based SRAF to make an arrangement rule of the SRAF as a rule to arrange the SRAF according to the rule around the main pattern and a model based SRAF for arranging the SRAF for the main pattern using a certain model.

When arranging the SRAF around the main pattern, it is desired to arrange the SRAF in a short time also for the main pattern including a layout pattern in which the SRAF arrangement is difficult.

BRIEF DESCRIPTION OF THE DRAWINGS

FIG. 1 is a block diagram of a configuration of a pattern forming device according to a first embodiment;

FIG. 2 is a flowchart of a procedure of an SRAF arranging process according to the first embodiment;

FIG. 5 is a view for illustrating the mask pattern forming process according to the first embodiment;

DETAILED DESCRIPTION

Figure 3A:
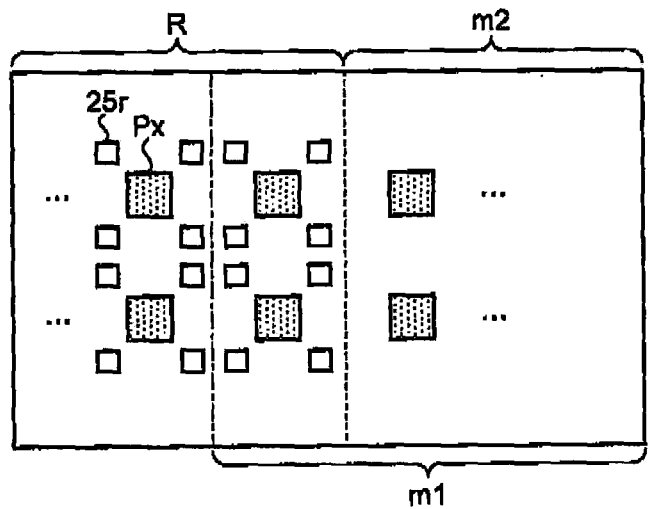
FIGS. 3A to 3C are views for illustrating an interference map forming region and a model based SRAF arranging region.

According to a sub-resolution assist feature arranging method in embodiments, it is selected which of a rule base according to a rule and a model base using a model is set for which pattern region on pattern data corresponding to a main pattern as a type of the method of arranging the sub-resolution assist feature for improving resolution of the main pattern formed on a substrate. Then, the sub-resolution assist feature by the rule base is arranged in a rule based region, which is the pattern region set as the rule base, as a rule based sub-resolution assist feature, and the sub-resolution assist feature by the model base is arranged in a model based region, which is the pattern region set as the model base, as a model based sub-resolution assist feature.

The sub-resolution assist feature arranging method and a computer program product and a manufacturing method of semiconductor device according to the embodiments are hereinafter described in detail with reference to the attached drawings. Meanwhile, the present invention is not limited by the embodiments.

First Embodiment

In this embodiment, an SRAF is arranged around a design pattern using both of the rule base and the model base in order to utilize both of advantages of a rule based SRAF and a model based SRAF. The SRAF is a pattern used in a photolithography process when manufacturing a semiconductor integrated circuit. Specifically, the SRAF is a pattern on mask, which is not transferred to the substrate such as a wafer, and the sub-resolution assist feature (pattern, which is not resolved) smaller than limiting resolution at the time of transfer to the substrate. The SRAF is arranged in the vicinity of the main pattern such as a circuit pattern, which should be transferred to the substrate. Meanwhile, in a following description, the rule based SRAF or the model based SRAF is sometimes referred to as the SRAF.

FIG. 1 is a block diagram of a configuration of a pattern forming device according to the first embodiment. A pattern forming device 1 is a device such as a computer, which arranges the SRAF smaller than resolution limit on an appropriate position around the design pattern, which composes the semiconductor device (integrated circuit).

The pattern forming device 1 arranges the SRAF in the vicinity of the main pattern on design pattern data in order to improve a lithography margin. The pattern forming device 1 of this embodiment arranges the SRAF in the vicinity of the main pattern using both of the rule base and the model base. Specifically, the model based SRAF is arranged only for a pattern with a narrow pitch in which the SRAF cannot be effectively arranged by the rule base and in a region in which application of the model based SRAF is supposed in advance, and the rule based SRAF is arranged in another region. According to this, the SRAF is arranged for the design pattern by combination of the rule base and the model base. The rule base is a method of arranging the SRAF according to the rule and the model base is the method of arranging the SRAF using the model.

The pattern forming device 1 is provided with an input unit 11, a design pattern storage 12, an SRAF arranging method selecting unit 13, a rule based SRAF arranging unit 14, an interference map forming unit 15, a model based SRAF arranging unit 16, and an output unit 17.

The input unit 11 inputs the design pattern of the semiconductor device and transmits the same to the design pattern storage 12. The design pattern storage 12 is a memory and the like for storing the design pattern transmitted from the input unit 11.

The SRAF arranging method selecting unit 13 selects a region in which the rule based SRAF is to be arranged (rule based region R to be described later) and a region in which the model based SRAF is to be arranged (model based region M to be described later) out of a region in which the design pattern is formed (design pattern region) based on the design pattern. In this embodiment, the SRAF arranging method selecting unit 13 selects the rule base for the region in which the SRAF may be arranged by the rule base and selects the model base for the region in which the SRAF cannot be arranged by the rule base. The SRAF arranging method selecting unit 13 transmits information indicating which region the rule based region R is to the rule based SRAF arranging unit 14. Also, the SRAF arranging method selecting unit 13 transmits information indicating which region the model based region M is to the interference map forming unit 15 and the model based SRAF arranging unit 16.

The rule based SRAF arranging unit 14 arranges the rule based SRAF for the design pattern region selected as the rule based region R. The rule based SRAF arranging unit 14 transmits the design pattern in which the rule based SRAF is arranged to the model based SRAF arranging unit 16.

The interference map forming unit 15 forms an interference map corresponding to the design pattern by an interference map method for the model based region M. The interference map is a coherent map indicating coherence of a projected optical system and indicates distribution (distribution information) of a degree of effect on resolution performance of the main pattern formed on a mask. The degree of effect on the resolution performance includes a process margin. The interference map is information indicating distribution of a degree of appropriateness (optimal degree) of an arranging position of the SRAF and divided into regions according to the degree of appropriateness. For example, the interference map is composed of a region in which a pattern of which shape is identical to that of the main pattern may be robustly formed for process variation (appropriate region) and a region in which only a pattern of which shape is significantly different from that of the main pattern may be formed (inappropriate region) when the SRAF is arranged. The interference map forming unit 15 transmits the formed interference map to the model based SRAF arranging unit 16.

The model based SRAF arranging unit 16 arranges the model based SRAF in the model based region M based on the interference map. The model based SRAF arranging unit 16 transmits the design pattern in which the rule based SRAF and the model based SRAF are arranged to the output unit 17. The output unit 17 outputs the design pattern in which the rule based SRAF and the model based SRAF are arranged to an external device such as an optical proximity correction (OPC) device 2.

Next, a procedure of an SRAF arranging process according to the first embodiment is described. FIG. 2 is a flowchart of the procedure of the SRAF arranging process according to the first embodiment. The design pattern is input to the input unit 11 of the pattern forming device 1. The design pattern is stored in the design pattern storage 12.

Thereafter, the SRAF arranging method selecting unit 13 selects a region to be set as the rule based region R (portion to which the rule base is applied) from the design pattern region based on the design pattern in the design pattern storage 12 (step S10). Specifically, the SRAF arranging method selecting unit 13 sets the region and the pattern in which the rule based SRAF may be arranged as the rule based region R. A criterion for judging whether the design pattern region is set as the rule based region R (application condition of the rule base) is set in the SRAF arranging method selecting unit 13 from a viewpoint of a mask constraint (constraint when fabricating the mask), the lithography margin, the design pattern (pitch, shape and magnitude (dimension) of the main pattern), presence or absence of transfer of the SRAF to the wafer, and an exposure condition, for example.

The SRAF arranging method selecting unit 13 extracts the pattern and the region in which the SRAF may be arranged by the rule base from the design pattern based on the criterion for judging and sets the extracted pattern and region as the rule based region R.

The SRAF arranging method selecting unit 13 transmits information indicating the region set as the rule based region R to the rule based SRAF arranging unit 14. The rule based SRAF arranging unit 14 arranges the rule based SRAF in the rule based region R (step S20). The rule based SRAF arranging unit 14 transmits the design pattern in which the rule based SRAF is arranged to the interference map forming unit 15.

Also, the SRAF arranging method selecting unit 13 selects the region to be set as the model based region M from the design pattern region (portion to which the model base is applied) based on the design pattern in the design pattern storage 12 (step S30). Specifically, the SRAF arranging method selecting unit 13 sets a region, which cannot be set as the rule based region R, out of the design pattern region as the model based region M. The region, which cannot be set as the rule based region R, is a region in which the mask constraint is violated, when the rule based SRAF is arranged even though there is a desired lithography margin, for example.

The SRAF arranging method selecting unit 13 transmits information indicating the region set as the model based region M to the interference map forming unit 15. The interference map forming unit 15 forms the interference map in the model based region M. Then, the interference map forming unit 15 transmits the formed interference map and the design pattern to the model based SRAF arranging unit 16.

The model based SRAF arranging unit 16 arranges the model based SRAF by the model base in the model based region M such that a desired design pattern may be formed based on the interference map (step S40).

Meanwhile, although a case in which the region to be set as the model based region M is selected after the rule based SRAF is arranged in the rule based region R is herein described, it is also possible to arrange the rule based SRAF in the rule based region R after selecting the region to be set as the model based region M. It is also possible to select the region to be set as the rule based region R after selecting the region to be set as the model based region M.

Meanwhile, the region in which the interference map forming unit 15 forms the interference map and the model based region M in which the model based SRAF arranging unit 16 arranges the model based SRAF may be different from each other. In this case, the SRAF arranging method selecting unit 13 sets two regions, which are a region in which the interference map is formed (interference map forming region m1 to be described later) and a region in which the model based SRAF is arranged (model based SRAF arranging region m2 to be described later), in place of the model based region M. The model based SRAF arranging region m2 in this case is the model based region M.

In this embodiment, a case in which the SRAF arranging method selecting unit 13 sets the interference map forming region m1 and the model based SRAF arranging region m2 in the design pattern region is described. Herein, the interference map forming region m1 and the model based SRAF arranging region m2 are described.

Figure 3B:
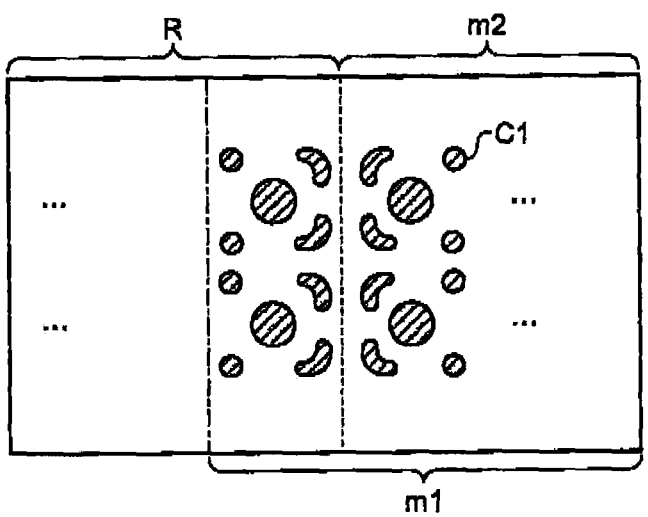
Figure 3C:
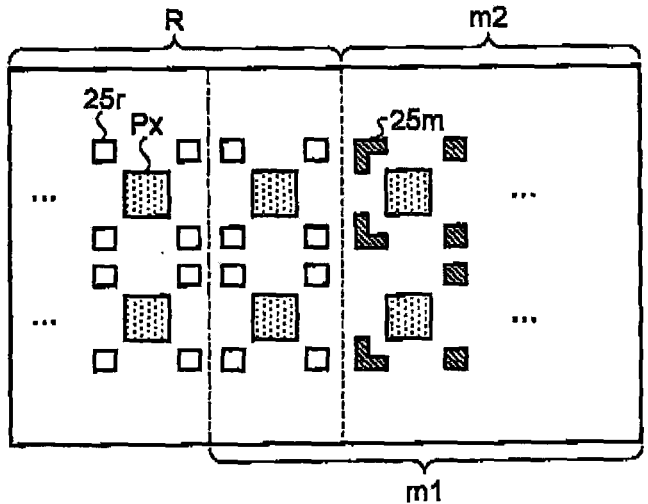

FIGS. 3A to 3C are views for illustrating the interference map forming region and the model based SRAF arranging region. FIG. 3A illustrates the design pattern when arranging a rule based SRAF 25r in the vicinity of a main pattern Px for the rule based region R.

In this embodiment, as illustrated in FIG. 3A, a region other than the rule based region R out of the design pattern region is set as the model based SRAF arranging region m2. Also, the interference map forming region m1 is set to be a region obtained by enlarging the model based SRAF arranging region m2 a little (region including only a predetermined region of the rule based region R). The interference map forming region m1 is a region set according to the model based region R. Specifically, the interference map forming region m1 is a region, which gives the degree of effect not smaller than a predetermined value to the resolution of the pattern arranged in the interference map forming region m1.

According to this, the interference map forming unit 15 forms the interference map in the interference map forming region m1 as illustrated in FIG. 3B. Herein, a region to improve resolution performance of the main pattern Px is indicated by a region C1 as the interference map. Meanwhile, the interference map forming unit 15 may form the interference map in the interference map forming region m1 for the design pattern in a state in which the rule based SRAF 25r is arranged or may form the interference map in the interference map forming region m1, for the design pattern in a state in which the rule based SRAF 25r is not arranged.

After the interference map is formed, the model based SRAF arranging unit 16 arranges the model based SRAF 25m in the model based SRAF arranging region m2 using the interference map formed in the interference map forming region m1 as illustrated in FIG. 3C.

Meanwhile, the rule based SRAF 25r may be arranged in consideration of the main pattern Px in the model based SRAF arranging region m2 or the rule based SRAF 25r may be arranged without regard to the main pattern Px in the model based SRAF arranging region m2.

It is also possible to arrange the model based SRAF 25m first and thereafter arrange the rule based SRAF 25r. In this case, the rule based SRAF 25r may be arranged in consideration of the model based SRAF 25m or the rule based SRAF 25r may be arranged without regard to the model based SRAF 25m.

Figure 4:
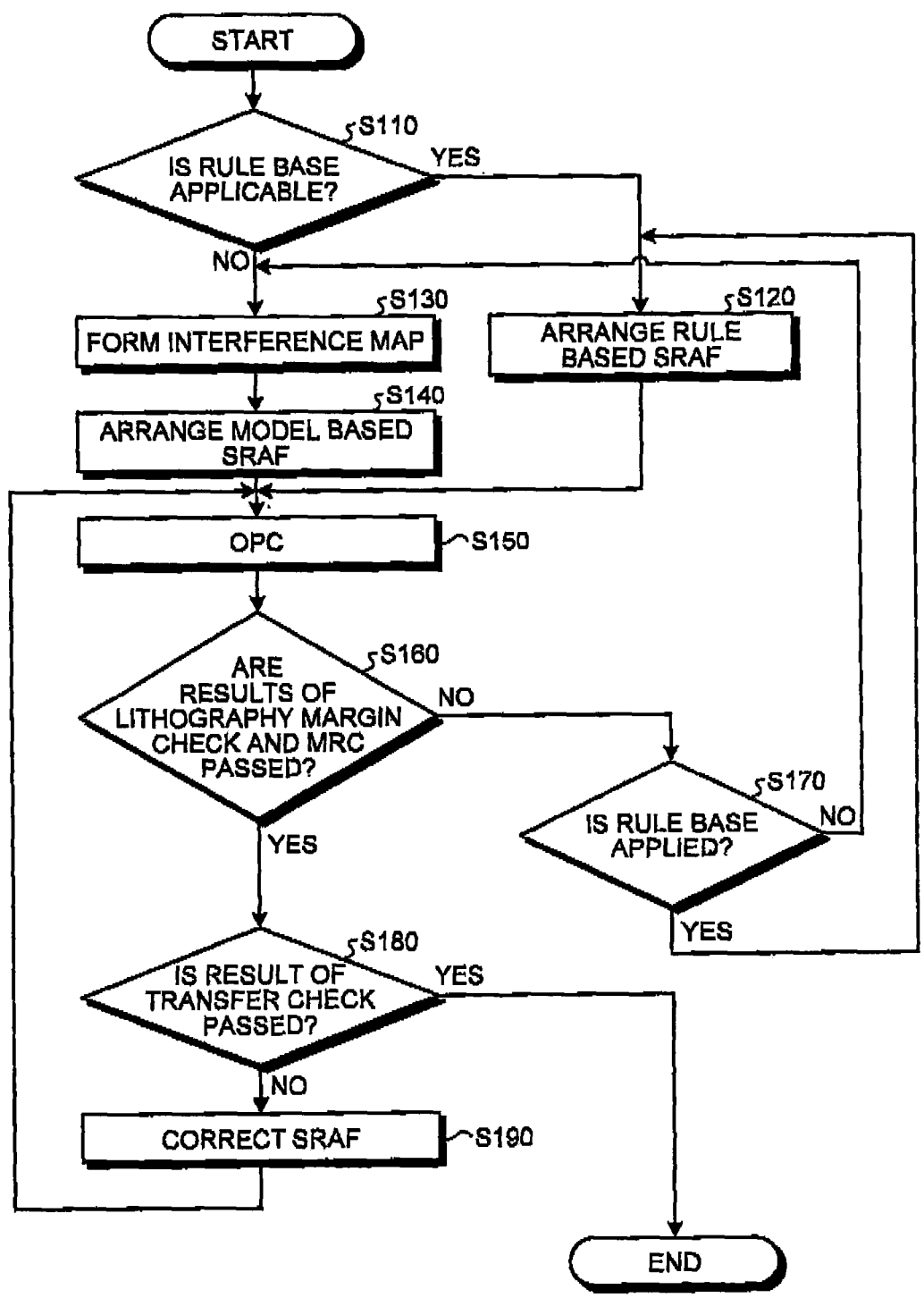
FIG. 4 is a flowchart of a procedure of a mask pattern forming process according to the first embodiment.

Next, a procedure of a mask pattern (pattern data) forming process is described. FIG. 4 is a flowchart of the procedure of the mask pattern forming process according to the first embodiment and FIG. 5 is a view for illustrating the mask pattern forming process according to the first embodiment.

After a design pattern D1 is formed, the design pattern D1 is input to the input unit 11 of the pattern forming device 1. The design pattern D1 is layout pattern data in which the main pattern Px is arranged as illustrated in FIG. 5. The design pattern D1 is stored in the design pattern storage 12. Thereafter, the SRAF arranging method selecting unit 13 judges whether the rule based SRAF 25r may be arranged by applying the rule base for each main pattern Px in the design pattern region (step S110). The region in which the rule based SRAF may be arranged is the region in which the mask constraint is not violated even when the rule based SRAF is arranged.

The main pattern Px and a region or a design layout to which it is judged that the rule base may be applied are set as the rule based region R and the main pattern and the region on the design layout to which it is judged that the rule base cannot be applied are set as the model based region M. The SRAF arranging method selecting unit 13 judges whether the rule base may be applied for each main pattern Px and each predetermined region in the design pattern.

For example, suppose that the rule base does not correspond to SRAF arrangement with a specific pitch. In this case, the SRAF arranging method selecting unit 13 classifies a pattern group of the main patterns Px by a pattern pitch and classifies the same into a pattern group for which the rule based SRAF 25r may be arranged and a pattern group for which the rule based SRAF 25r cannot be arranged.

When it is judged that the rule base may be applied (step S110, Yes), the rule based SRAF arranging unit 14 arranges the rule based SRAF 25r in the rule based region R to which it is judged that the rule base may be applied (step S120).

On the other hand, when it is judged that the rule base cannot be applied (step S110, No), the interference map forming unit 15 forms the interference map in the region to which it is judged that the rule base cannot be applied and around the same (step S130). For example, an interference map D2 as illustrated in FIG. 5 is formed in the interference map forming region m1. Then, the model based SRAF arranging unit 16 arranges a model based SRAF 25m in the model based SRAF arranging region m2 based on the interference map D2 (step S140). In other words, the interference map forming region m1 is converted to the SRAF. According to this, a design pattern D3 in which the rule based SRAF 25r and the model based SRAF 25m are arranged is formed.

Thereafter, a lithography target is formed using the design pattern D3 in which the rule based SRAF 25r and the model based SRAF 25m are arranged. The OPC device 2 performs optical proximity correction (OPC) to the lithography target (step S150). According to this, a mask pattern D4 after the OPC is formed. In FIG. 5, in the mask pattern D4, the main pattern after the OPC is indicated by Py and the rule based SRAF 25r and the model based SRAF 25m are indicated by SRAF 25x.

Thereafter, a lithography compliance check (LCC) is performed to the mask pattern D4. The LCC is a lithography margin check, a mask rule check (MRC), a transfer check and the like. As the LCC, the transfer check is performed after the lithography margin check and the MRC are performed, for example.

The lithography margin check is a process in which it is judged whether a pattern on wafer having desired dimension may be formed even when a dose and a focus in an exposure process when forming the pattern on wafer are shifted from desired values. The lithography margin check is performed by applying optical simulation to the mask pattern D4 after the OPC, for example. At the time of the lithography margin check, the lithography margin is calculated and it is checked whether there is the main pattern Px and the region on the design layout, which do not reach an allowable specification. A result of the lithography margin check is failed when there is the main pattern Px and the region on the design layout, which do not reach the allowable specification, and is passed when there is no such region.

Also, the MRC is a process in which it is judged whether the mask pattern is formed following the mask constraint. At the time of the MRC, it is checked whether there is the rule based SRAF 25r, the model based SRAF 25m, and the main pattern Px, which violate the mask constraint. A result of the MRC is failed when there is any of the rule based SRAF 25r, the model based SRAF 25m, and the main pattern Px, which violates the mask constraint, and is passed when there is no such region.

When at least one of the results of lithography margin check and the MRC is failed (step S160, No), the SRAF of a failed region is arranged again so as not to be failed. Specifically, when the rule base is applied (step S170, Yes), the procedure returns to at the step S120 and the rule based SRAF arranging unit 14 arranges again the rule based SRAF 25r. For example, when a portion in which the rule based SRAF 25r is arranged is failed, the rule base is applied, and when a portion in which the model based SRAF 25m is arranged is failed, the model base is applied. When arranging the rule based SRAF 25r, the rule of the rule base is changed such that the lithography margin is improved while the mask constraint is followed.

Also, when the rule base is not applied (step S170, No), the procedure returns to the step S130, and the interference map forming unit 15 forms the interference map. At that time, a parameter (forming condition of the interference map) used for forming the interference map is changed such that the lithography margin becomes larger while the mask constraint is followed. According to this, the interference map is adjusted. Then, the model based SRAF arranging unit 16 arranges again the model based SRAF 25m based on the interference map.

The processes at the steps S120 to S170 are repeated until both of the results of the lithography margin check and the MRC are passed. When both of the results of the lithography margin check and the MRC are passed (step S160, Yes), the transfer check is performed. The transfer check is the check whether the rule based SRAF 25r and the model based SRAF 25m are transferred on the substrate when the main pattern Px is pattern formed on the substrate using the design pattern in which the rule based SRAF 25r and the model based SRAF 25m are arranged.

In this embodiment, since the optical simulation is performed in the lithography margin check at the time of the process at the step S160, the transfer check is performed using a result of the optical simulation. Specifically, it is checked whether the rule based SRAF 25r and the model based SRAF 25m as an exposure pattern are not formed aside from the main pattern Px. When the rule based SRAF 25r and the model based SRAF 25m are transferred on the substrate, a result of the transfer check is failed, and when they are not transferred, the result of the transfer check is passed.

When the result of the transfer check is failed (step S180, No), the rule based SRAF 25r and the model based SRAF 25m judged to be transferred on the substrate are corrected (finely adjusted) (step S190). For example, by making the rule based SRAF 25r and the model based SRAF 25m failed in the transfer check small (by adjusting a size thereof), the SRAF is corrected. Thereafter, the procedure returns to the step S150 and the OPC is performed.

Thereafter, the processes at the step S150, S160, S180, and S190 are repeated until the result of the transfer check is passed. Meanwhile, when at least one of the results of the lithography margin check and the MRC is failed (step S160, No), the processes at the steps S120 to S170 are repeated until both of the results of the lithography margin check and the MRC are passed.

As illustrated in FIG. 5, at the time of the LCC such as the lithography margin check, the MRC, and the transfer check, a pattern on mask 35 formed by the optical simulation using the mask pattern D4, and the design pattern and the lithography target (pattern, which should be formed in a lithography process) are compared with each other. FIG. 5 illustrates a case in which the pattern on mask 35 and the lithography target 33 are compared with each other.

When the result of the transfer check is passed (step S180, Yes), the pattern after the OPC, which is passed in the transfer check, is adopted as the mask pattern. The mask is fabricated using the mask pattern.

In this manner, the rule based SRAF 25r is arranged in the rule based region R and the model based SRAF 25m is arranged in the model based region M, so that mixed arrangement of the rule based SRAF 25r and the model based SRAF 25m becomes possible. Also, since the rule based SRAF 25r is arranged in the region in which the arrangement by the rule base is possible and the model based SRAF 25m is arranged in another region, the SRAF arrangement, which utilizes the advantages of the rule base and the model base, becomes possible. Therefore, it becomes possible to improve the lithography margin of a line pattern and a contact pattern, which compose the main pattern Px, and to improve a yield ratio and reliability of a semiconductor chip formed using the main pattern Px.

The mask pattern is formed for each layer of a wafer process, for example. Then, the semiconductor device (semiconductor integrated circuit) is manufactured using the mask fabricated using the mask pattern. Specifically, the mask is fabricated using the mask pattern for which the SRAF 25x corresponding to the rule based SRAF 25r and the model based SRAF 25m is arranged. Then, exposure is performed using the mask to the wafer to which resist is applied, and thereafter the wafer is developed and a resist pattern is formed on the wafer. Then, after removing the resist pattern, a lower layer side of the resist pattern is etched. According to this, an actual pattern corresponding to the resist pattern is formed on the wafer. When manufacturing the semiconductor device, the arrangement of the rule based SRAF 25r and the model based SRAF 25m, the formation of the mask pattern, the fabrication of the mask, the exposure process, the development process, and the etching process described above are repeated for each layer.

Meanwhile, the interference map forming region m1 in which the interference map forming unit 15 forms the interference map and the model based SRAF arranging region m2 in which the model based SRAF arranging unit 16 arranges the model based SRAF 25m may be the same region. Also, the interference map forming region m1 may be on an entire surface of the design pattern.

Although a case in which the rule based region R and the model based region M (model based SRAF arranging region m2) are set such that the rule based region R and the model based region M are adjacent to each other is described in this embodiment, a predetermined space region may be provided between the rule based region R and the model based region M. In this case, the design pattern in which the predetermined space region (space region 60 to be described later) is provided between the rule based region R and the model based region M in advance is formed.

The space region 60 is a region with a width such that the rule based SRAF 25r does not affect the model based region M about the resolution and the mask constraint (region in which the main pattern Px is not formed) and the region with the width such that the model based SRAF 25m does not affect the rule based region R about the resolution and the mask constraint.

In other words, the space region 60 is the region with a predetermined width arranged such that the rule based SRAF 25r does not give the degree of effect not smaller than the predetermined value to the resolution of the pattern arranged in the model based region M and that the model based SRAF 25m does not give the degree of effect not smaller than the predetermined value to the resolution of the pattern arranged in the rule based region R.

Figure 6A:
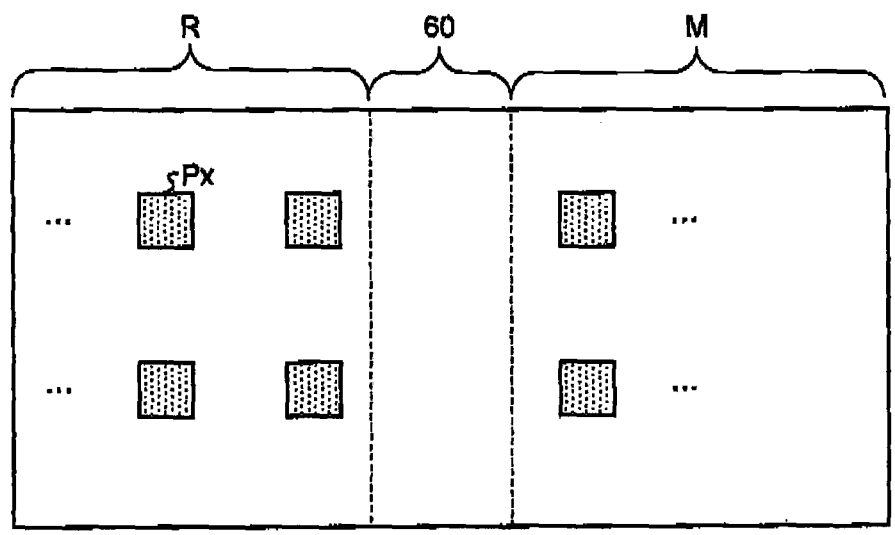
FIGS. 6A and 6B are views for illustrating a space region formed between a rule based region and a model based region.
Figure 6B:
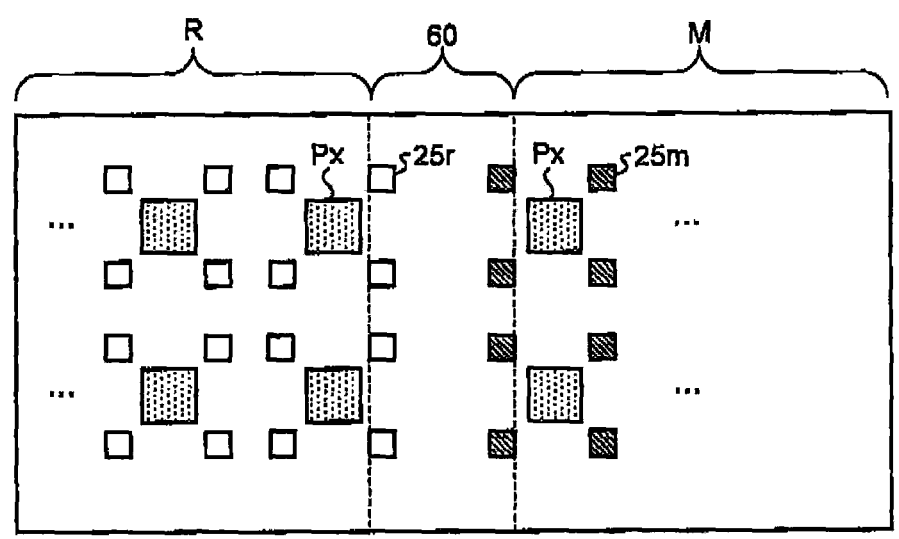

FIGS. 6A and 6B are views for illustrating the space region formed between the rule based region and the model based region. As illustrated in FIG. 6A, when forming the design pattern, the space region 60 is provided between the rule based region R and the model based region M in advance.

Then, the rule based SRAF 25r is arranged for the space region 60 and the rule based region R. Also, the model based SRAF 25m is arranged for the space region 60 and the model based region M.

In this manner, since the space region 60 is provided, there is the predetermined width between the rule based SRAF 25r and the model based SRAF 25m. Also, there is the predetermined width between the rule based SRAF 25r and the main pattern Px in the model based region M, and between the model based SRAF 25m and the main pattern Px in the rule based region R. Therefore, the rule based SRAF 25r does not affect the model based SRAF 25m and the main pattern Px in the model based region M about the resolution and the mask constraint. Also, the model based SRAF 25m does not affect the rule based SRAF 25r and the main pattern Px in the rule based region R about the resolution and the mask constraint.

When providing the space region 60 between the rule based region R and the model based region M, the rule based region R and the model based region M are set in the design pattern by the SRAF arranging method selecting unit 13. Then, the SRAF arranging method selecting unit 13 perform correction of the design pattern such that the space region 60 is provided for the design pattern in which the rule based region R and the model based region M are set. Meanwhile, it is also possible to provide a function similar to that of the SRAF arranging method selecting unit 13 in the design pattern forming device to judge the rule based region R and the model based region M in the design pattern while arranging the main pattern Px by the SRAF arranging method selecting unit 13, and provide the space region 60 based on a judgment result.

Meanwhile, when the space region 60 is provided between the rule based region R and the model based region M, any of the rule based SRAF 25r and the model based SRAF 25m may be arranged first. It is possible to simultaneously arrange the rule based SRAF 25r and the model based SRAF 25m and arrange any of the rule based SRAF 25r and the model based SRAF 25m first.

Also, the interference map forming region m1 may be a region, obtained by combining the model based region M and the space region 60 or the same region as the model based region M. Also, the interference map forming region m1 may be a region obtained by combining a part of the space region 60 and the model based region M or the region obtained by combining a part of the rule based region R, the space region 60, and the model based region M.

Although a case in which the rule based SRAF 25r and the model based SRAF 25m are arranged for the design pattern is described in this embodiment, it is also possible to arrange the rule based SRAF 25r and the model based SRAF 25m around the lithography target formed using the design pattern.

Although the rule based SRAF 25r and the model based SRAF 25m are arranged again when the results of the lithography margin check and the MRC are not passed, it is also possible to combine or delete the rule based SRAF 25r and the model based SRAF 25m. For example, when the mask constraint is not satisfied due to overlapping of the rule based SRAF 25r and the model based SRAF 25m, the overlapped rule based SRAF 25r and model based SRAF 25m may be combined. Also any of the overlapped rule based SRAF 25r and the model based SRAF 25m may be deleted.

Also, when arranging again the rule based SRAF 25r and the model based SRAF 25m, the region set as the rule based region R, the region set as the interference map forming region m1, and the region set as the model based SRAF arranging region m2 may be changed.

Although a case in which the rule based SRAF 25r and the model based SRAF 25m are corrected when the result of the transfer check is failed is described in this embodiment, it is also possible that the procedure returns to the step S170 and the rule based SRAF 25r and the model based SRAF 25m are arranged again.

Also, the rule based region R and the model based region M are not divided only for each main pattern but may be divided also for each predetermined region. In this case, when there is any main pattern Px out of the main patterns Px in a predetermined region to which the rule base cannot be applied, all the main patterns in the predetermined region are set as the model based region M. According to this, it becomes easy to divide the rule based region R and the model based region M and to arrange the rule based SRAF 25r and the model based SRAF 25m.

In this manner, according to the first embodiment, the rule based region R and the model based region M are set based on the design pattern and the mask constraint, so that it becomes possible to appropriately set the rule based region R and the model based region M. Therefore, the SRAF arrangement, which utilizes both of the advantages of the rule based SRAF 25r and the model based SRAF 25m, becomes possible.

In the SRAF arrangement by the rule base, an SRAF rule may be designed in consideration of transfer inhibition of the SRAF and the mask constraint, so that possibility that the transfer of the SRAF occurs after arranging the SRAF and possibility that the SRAF is arranged again due to the mask constraint violation may be decreased.

Also, in the SRAF arrangement by the rule base, a shape, magnitude and an arranging position of the SRAF are determined in advance to be made the rule and the SRAF is actually arranged following the rule, so that it may be substantially figured out the rule to be applied and the SRAF to be arranged. Therefore, it is easy to correct the SRAF and the SRAF rule. Also, by carefully designing or correcting the rule based SRAF, the mask rule violation due to lack of space between the SRAFs and between the SRAF and the main pattern may be inhibited from occurring. Also, the SRAF arrangement by the rule base may share a result of calculation of the SRAF arrangement to decrease an amount of calculation, and as a result, a processing time of the mask pattern data formation may be made short.

Also, in the SRAF arrangement by the model base, the SRAF capable of improving the lithography margin may be arranged also for a layout pattern in which there is difficulty in improving the lithography margin and the layout pattern in which there is difficulty in the SRAF arrangement.

Second Embodiment

Next, a second embodiment of the invention is described with reference to FIGS. 7 to 11. In the second embodiment, the rule based SRAF 25r is arranged on an entire surface of the design data without setting the rule based region R and the model based region M, and thereafter, the model based SRAF 25m is arranged in a portion on which the rule based SRAF 25r cannot be appropriately arranged.

Figure 7:
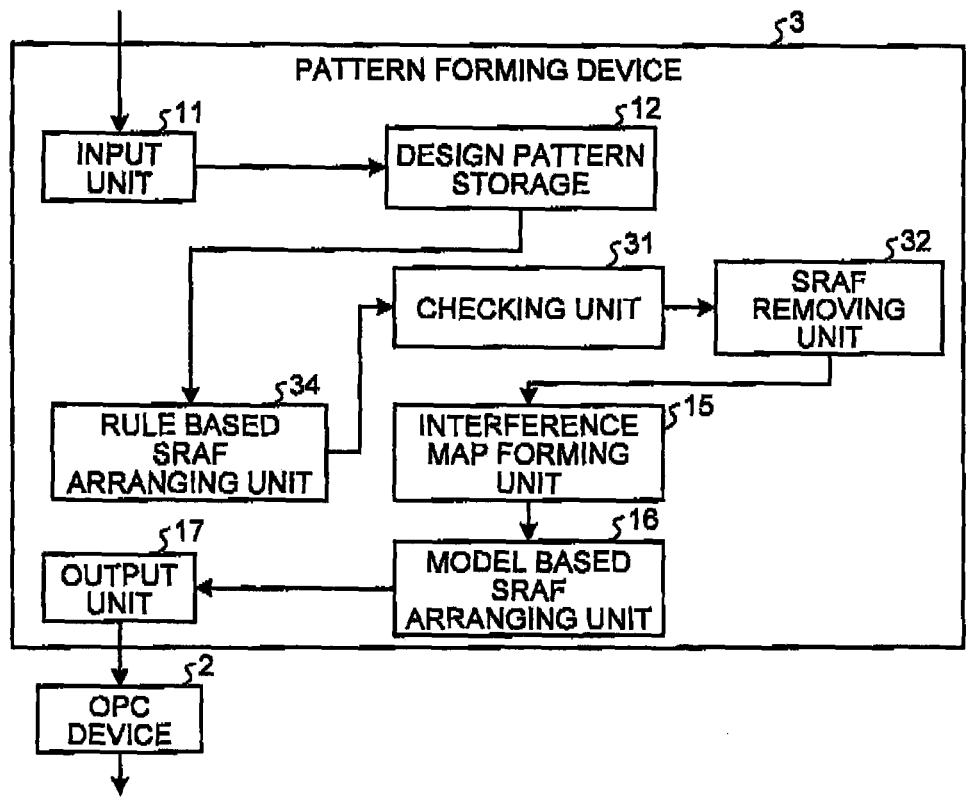
FIG. 7 is a block diagram of a configuration of the pattern forming device according to a second embodiment.

FIG. 7 is a block diagram of a configuration of the pattern forming device according to the second embodiment. An identical number is assigned to a component, which achieves a function identical to that of the pattern forming device 1 of the first embodiment illustrated in FIG. 1, out of each component in FIG. 7 and an overlapping description is omitted.

A pattern forming device 3 is provided with the input unit 11, the design pattern storage 12, the interference map forming unit 15, the model based SRAF arranging unit 16, the output unit 17, a checking unit 31, an SRAF removing unit 32, and a rule based SRAF arranging unit 34.

The rule based SRAF arranging unit 34 has a function similar to that of the rule based SRAF arranging unit 14. The rule based SRAF arranging unit 34 arranges the rule based SRAF 25*r* for an entire region on the design pattern. In this embodiment, the rule based SRAF arranging unit 34 tries to arrange the rule based SRAF 25*r* in the meantime in a situation in which it is not at all known which main pattern Px is present as a pattern group of an SRAF arrangement target. The rule based SRAF arranging unit 34 transmits the design pattern in which the rule based SRAF 25*r* is arranged to the checking unit 31.

The checking unit 31 checks whether the rule based SRAF 25*r* is appropriately arranged on a desired position based on the design pattern in which the rule based SRAF 25*r* is arranged. Specifically, the checking unit 31 judges a portion in which the rule based SRAF 25*r* is appropriately arranged on the design pattern and a portion in which the rule based SRAF 25*r* is not appropriately arranged. For example, the checking unit 31 judges that a portion in the vicinity of the main pattern Px in which the lithography margin does not achieve the desired specification by the arrangement of the rule based SRAF 25*r* is a portion in which the rule based SRAF 25*r* is not appropriately arranged. Also, the checking unit 31 judges that a portion in the vicinity of the main pattern Px in which the rule based SRAFs 25*r* are too close to each other and the mask constraint violation occurs is the portion in which the rule based SRAF 25*r* is not appropriately arranged. The checking unit 31 transmits the portion (region) in which the rule based SRAF 25*r* is not appropriately arranged to the SRAF removing unit 32.

The SRAF removing unit 32 removes the rule based SRAF 25*r* in the region in which the rule based SRAF 25*r* is inappropriately arranged from the design pattern. The SRAF removing unit 32 transmits the design pattern in which the rule based SRAF 25*r* is arranged on an appropriate position to the interference map forming unit 15. The design pattern in which the rule based SRAF 25*r* is arranged only on the appropriate position is the design pattern obtained by removing the inappropriately arranged rule based SRAF 25*r* from the design pattern in which the rule based SRAF 25*r* is arranged.

The interference map forming unit 15 of this embodiment forms the interference map in a region in which the rule based SRAF 25*r* is not arranged out of the design pattern (SRAF non-arranging region). The interference map forming unit 15 may form the interference map in the SRAF non-arranging region for the design pattern in a state in which the rule based SRAF 25*r* is arranged or form the interference map in the SRAF non-arranging region for the design pattern in a state in which the rule based SRAF 25*r* is not arranged.

It is difficult to form the rule base (SRAF rule) capable of arranging the rule based SRAF 25*r* for an entire design pattern composed of the main pattern Px. This is because a long time is required for making an arrangement rule of the SRAF the rule for the entire design pattern. Therefore, in this embodiment, the checking unit 31 extracts the main patterns Px of following (1) to (3): (1) the main pattern Px in which the lithography margin does not achieve the desired specification by the arrangement of the rule based SRAF 25*r*, (2) the main pattern Px of which rule based SRAFs 25*r* are too close to each other and the mask constraint violation occurs, and (3) the main pattern Px, which does not conform to an SRAF arranging condition of the SRAF rule, so that the rule based SRAF 25*r* cannot be arranged.

The SRAF removing unit 32 removes the rule based SRAF 25*r* arranged in the vicinity of the main patterns Px of the above-described (1) and (2) and transmits the design pattern after removing the rule based SRAF 25*r* to the interference map forming unit 15. In the interference map forming unit 15, the interference map is formed in the SRAF non-arranging region.

Figure 8:
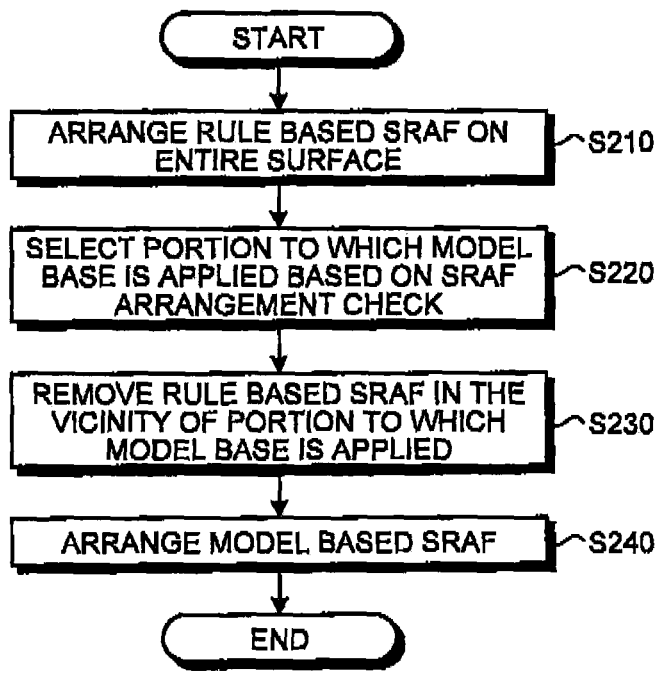
FIG. 8 is a flowchart of the procedure of the SRAF arranging process according to the second embodiment.

Next, the procedure of the SRAF arranging process according to the second embodiment is described. FIG. 8 is a flowchart of the procedure of the SRAF arranging process according to the second embodiment. Meanwhile, out of the processes illustrated in FIG. 8, the description of the process similar to the process illustrated in FIG. 2 of the first embodiment is omitted.

The design pattern is input to the input unit 11 of the pattern forming device 3. The design pattern is stored in the design pattern storage 12. Thereafter, the rule based SRAF arranging unit 34 arranges the rule based SRAF 25*r* by the rule base on the entire surface of the design pattern (step S210). The rule based SRAF arranging unit 34 transmits the design pattern in which the rule based SRAF 25*r* is arranged to the checking unit 31.

The checking unit 31 checks whether the rule based SRAF 25*r* is arranged on a desired position (SRAF arrangement check) based on the design pattern in which the rule based SRAF 25*r* is arranged. Then, the checking unit 31 selects the portion to which the model base is applied out of the main pattern based on the SRAF arrangement check (step S220). The checking unit 31 transmits information to specify the main pattern Px for which the appropriate rule based SRAF 25*r* is not arranged (NG portion) and the design pattern in which the rule based SRAF 25*r* is arranged to the SRAF removing unit 32.

The SRAF removing unit 32 removes the inappropriate rule based SRAF 25*r* from the design pattern based on the information transmitted from the checking unit 31. In other words, the SRAF removing unit 32 removes the rule based SRAF 25*r* in the vicinity of the portion to which the model base is applied out of the rule based SRAF 25*r* in the design pattern (step S230). The rule based SRAF 25*r* in the vicinity of the portion to which the model base is applied is the rule based SRAF 25*r* in which the mask constraint violation occurs when the rule based SRAF 25*r* is arranged, for example. The SRAF removing unit 32 transmits the design pattern in which the rule based SRAF 25*r* is arranged only on the appropriate position to the interference map forming unit 15.

The interference map forming unit 15 forms the interference map for the main pattern Px for which the rule based SRAF 25*r* is not arranged. At that time, the interference map forming unit 15 judges whether each main pattern Px is the main pattern Px for which the rule based SRAF 25*r* is not arranged and extracts the main pattern Px for which the rule based SRAF 25*r* is not arranged. The interference map forming unit 15 judges whether each main pattern Px is the main pattern Px for which the rule based SRAF 25*r* is not arranged based on area density of the rule based SRAF 25*r* arranged on the design pattern, for example.

In this case, the interference map forming unit 15 judges whether each main pattern Px is the main pattern Px for which the rule based SRAF 25*r* is not arranged based on a ratio of an area of the space region obtained by eliminating the main pattern Px from the region in which the main pattern Px is formed to an area of the rule based SRAF 25*r*. For example, an area of a predetermined region (for example, a judgment target region such as a rectangular region) formed of the main pattern Px and a region around the main pattern Px, which is a judgment target, is calculated. Also, the area of the rule based SRAF 25*r* included in the predetermined region is calculated. Then, a ratio (density) of the area of the rule based SRAF 25r relative to the area of the predetermined region is calculated. The interference map forming unit 15 judges that the main pattern Px is that for which the rule based SRAF 25r is not arranged when the area density of the rule based SRAF 25r arranged on the design pattern is smaller than a predetermined value. According to this, it becomes possible to easily extract the main pattern Px for which the rule based SRAF 25r is not arranged.

The main pattern Px for which the rule based SRAF 25r is not arranged is the main patterns Px of following (1) to (3): (1) the main pattern Px in which the lithography margin does not achieve the desired specification by the arrangement of the rule based SRAF 25r, (2) the main pattern Px in which the mask constraint violation occurs, and (3) the main pattern Px, which does not conform to the SRAF arrangement condition of the SRAF rule, so that the rule based SRAF 25r cannot be arranged (the main pattern Px failed in arranging the rule based SRAF 25r).

Meanwhile, the interference map forming unit 15 may judge whether each main pattern Px is the main pattern Px for which the rule based SRAF 25r is not arranged based on the area density (density) of the rule based SRAF 25r in the design pattern region including the main pattern Px.

The interference map forming unit 15 transmits the formed interference map and the design pattern to the model based SRAF arranging unit 16. The model based SRAF arranging unit 16 arranges the model based SRAF 25m in the region identical to the region in which the interference map is formed based on the interference map (step S240).

In this manner, in this embodiment, the main pattern Px for which the SRAF cannot be appropriately arranged by the rule base may be extracted as a result of the SRAF arrangement check of the rule based SRAF 25r. Therefore, the model based SRAF 25m is arranged for the extracted main pattern Px to ensure the lithography margin.

Figure 9:
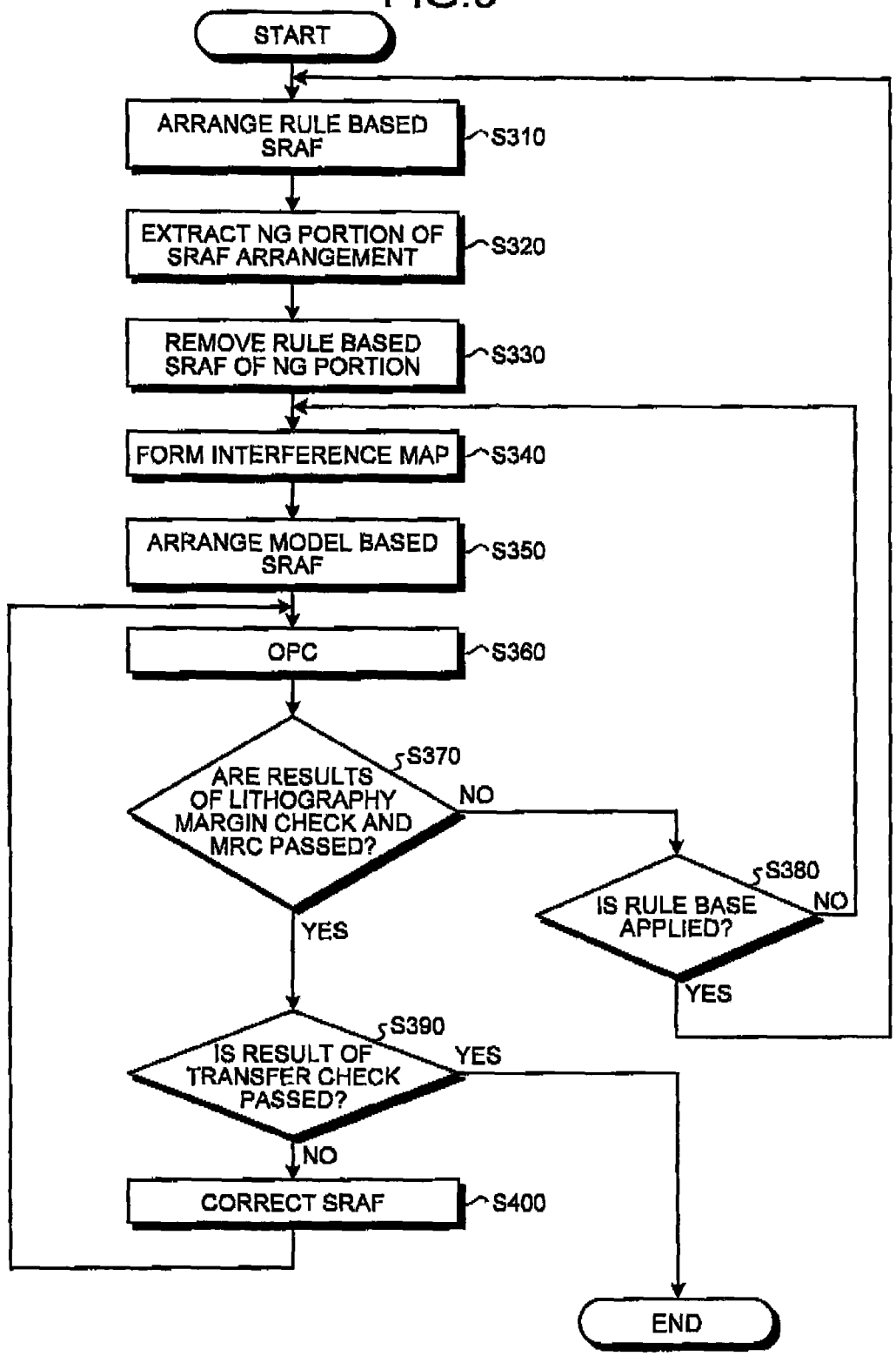
FIG. 9 is a flowchart of the procedure of the mask pattern forming process according to the second embodiment.

Next, the procedure of the mask pattern (pattern data) forming process is described. FIG. 9 is a flowchart of the procedure of the mask pattern forming process according to the second embodiment, and FIGS. 10A to 10F are views for illustrating the mask pattern forming process according to the second embodiment. Meanwhile, out of the processes illustrated in FIGS. 9 and 10A to 10F, the description of the process similar to the process illustrated in FIGS. 4 and 5 of the second embodiment is omitted.

Figure 10A:
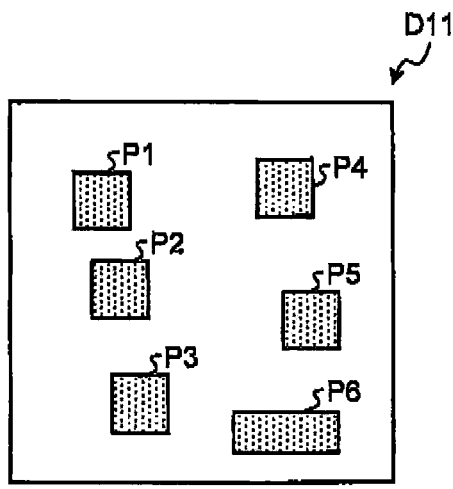
FIGS. 10A to 10F are views for illustrating the mask pattern forming process according to the second embodiment.

After a design pattern D11 is formed, the design pattern D11 is input to the input unit 11 of the pattern forming device 3. The design pattern D11 is layout pattern data in which main patterns P1 to P6 are arranged as the main pattern Px as illustrated in FIG. 10A. The design pattern D11 is stored in the design pattern storage 12.

Thereafter, the rule based SRAF arranging unit 34 arranges the rule based SRAF 25r by the rule base on the entire surface of the design pattern (step S310). In FIG. 10S, a case in which the main patterns for which the rule based SRAF 25r may be arranged are P1 to P5 and the main pattern for which the rule based SRAF 25r cannot be arranged is P6 is illustrated. The rule based SRAF arranging unit 34 transmits design pattern D12 in which the rule based SRAF 25r is arranged to the checking unit 31.

The checking unit 31 extracts the main pattern Px, which is the NG portion for which the rule based SRAF 25r is not appropriately arranged, out of the main patterns P1 to P6 based on the design pattern 112 in which the rule based SRAF 25r is arranged (step S320). The NG portion is the main pattern Px of which rule based SRAF 25r violates the mask constraint, for example.

Figure 10B:
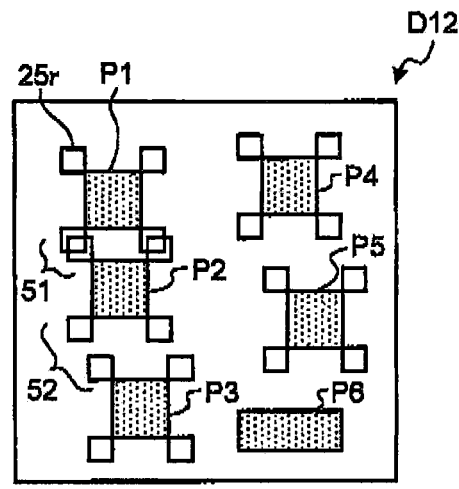

In FIG. 10B, the rule based SRAFs 25r overlapped with each other are illustrated as an SRAF group 51. Also, the rule based SRAFs 25r in which distance therebetween is shorter than the mask constraint are illustrated as an SRAF group 52. The SRAF group 51 is the rule based SRAFs 25r of the main patterns P1 and P2 and the SRAF group 52 is the rule bases SRAFs 25r of the main patterns P2 and P3. The checking unit 31 transmits information to specify the main patterns P1 to P3 and the design pattern D12 in which the rule based SRAF 25r is arranged as the information to specify the NG portion to the SRAF removing unit 32.

Figure 10C:
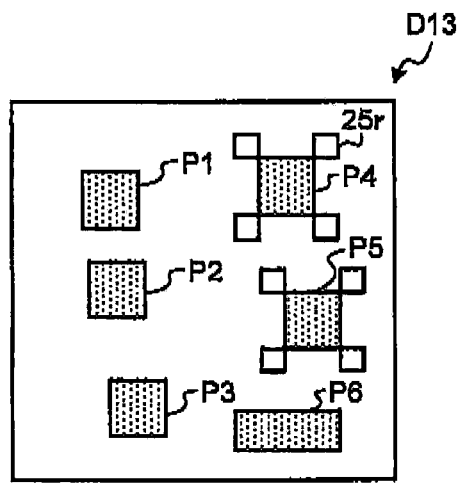

The SRAF removing unit 32 removes the rule based SRAF 25r arranged in the vicinity of the main pattern Px, which is the NG portion, from the design pattern D12 based on the information transmitted from the checking unit 31 (step S330). The SRAF removing unit 32 herein deletes the SRAF groups 51 and 52 (rule based SRAFs 25r of the main patterns P1 to P3) as the rule based SRAF 25r, which violates the mask constraint. In FIG. 10C, design pattern D13 in which the rule based SRAFs 25r of the main patterns P1 to P3 corresponding to the SRAF groups 51 and 52 are deleted from the design pattern is illustrated.

The SRAF removing unit 32 transmits the design pattern D13 from which the rule based SRAF 25r of the NG portion is removed to the interference map forming unit 15. In other words, the SRAF removing unit 32 transmits the design pattern D13 in which the rule based SRAF 25r is arranged only on the appropriate position to the interference map forming unit 15.

Figure 10D:
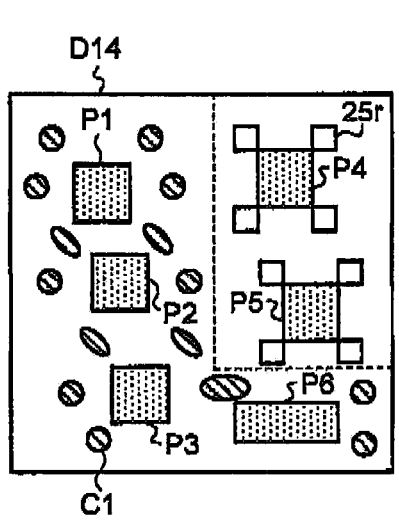

The interference map forming unit 15 extracts the main pattern for which the rule based SRAF 25r is not arranged (herein, the main patterns P1 to P3 and P6) based on the design pattern D13. The interference map forming unit 15 forms the interference map in the vicinity of the main patterns P1 to P3 and P6 for which the rule based SRAF 25r is not arranged based on the extracted information, the design pattern D13, and the information to specify the main patterns P1 to P3 and P6 for which the rule based SRAF 25r is not arranged (step S340). FIG. 10D illustrates the interference map in the vicinity of the main patterns P1 to P3 and P6 and the main patterns P1 to P3 and P6 as an interference map D14. The interference map forming unit 15 transmits the formed interference map D14 to the model based SRAF arranging unit 16.

Figure 10E:
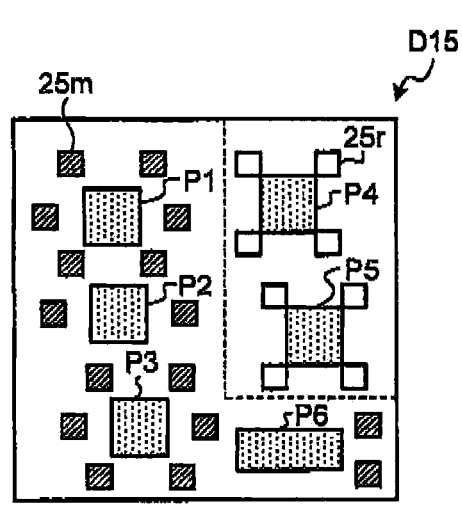
Figure 10F:
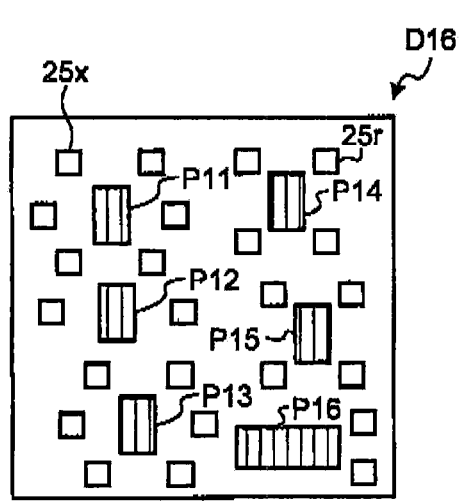

The model based SRAF arranging unit 16 arranges the model based SRAF 25m in the vicinity of the main pattern for which the rule based SRAF 25r is not arranged (herein, the main patterns P1 to P3 and P6) based on the interference map D14 (step S350). FIG. 10E illustrates a design pattern D15 in which the model based SRAF 25m is arranged in the vicinity of the main patterns P1 to P3 and P6 and the rule based SRAF 25r is arranged in the vicinity of the main patterns P4 and P5.

The model based SRAF arranging unit 16 outputs the design pattern in which the rule based SRAF 25r and the model based SRAF 25m are arranged to the OPC device 2 through the output unit 17. Thereafter, the OPC is performed by the OPC device 2 as in the first embodiment (step S360), and according to this, the mask pattern is formed. In a mask pattern D16 illustrated in FIG. 10F, the main patterns P1 to P6 after the OPC are indicated by main patterns P11 to P16 and the rule based SRAF 25r and the model based SRAF 25m are indicated by the SRAF 25x.

Thereafter, as in the first embodiment, the LCC is performed to the mask pattern D16. Processes at steps S370 to S400 herein correspond to the processes at the steps S160 to S190 of the first embodiment, respectively.

In this embodiment, when at least one of the results of the lithography margin check and the MRC is failed and the rule based SRAF 25r is arranged by applying the rule base (step S380, Yes), the procedure returns to the step S310 and the rule based SRAF arranging unit 34 arranges again the rule based SRAF 25r in a failed region.

Also, when the rule base is not applied (step S380, No), the interference map forming unit 15 forms the interference map. Then, the model based SRAF arranging unit 16 arranges again the model based SRAF 25m based on the interference map.

Meanwhile, in this embodiment also, as in the first embodiment, the region in which the interference map is formed and the region in which the model based SRAF 25m is arranged may be the different regions.

Next, hardware configurations of the pattern forming device 1 described in the first embodiment and the pattern forming device 3 of the second embodiment are described. Meanwhile, since the pattern forming devices 1 and 3 have the similar configurations, the configuration of the pattern forming device 1 is herein described.

Figure 11:
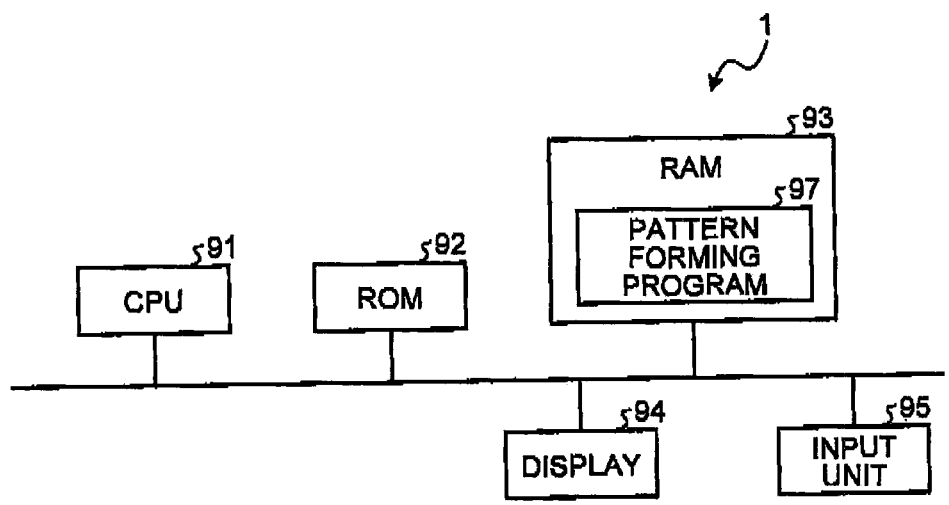
FIG. 11 is a view of a hardware configuration of the pattern forming device.

FIG. 11 is a view of the hardware configuration of the pattern forming device. The pattern forming device 1 includes a central processing unit (CPU) 91, a read only memory (ROM) 92, a random access memory (RAM) 93, a display 94, and an input unit 95. In the pattern forming device 1, the CPU 91, the ROM 92, the RAM 93, the display 94, the input unit 95, and an output unit not illustrated are connected through a bus line.

The CPU 91 forms the pattern using a pattern forming program 97 being a computer program. The display 94 is a display device such as a liquid-crystal monitor for displaying the design pattern and the like in which the design pattern, the rule based SRAF 25r, and the model based SRAF 25m are arranged based on an instruction from the CPU 91. The input unit 95 is provided with a mouse and a keyboard for inputting instruction information externally input from a user (parameter and the like necessary for the SRAF arrangement). The instruction information input to the input unit 95 is transmitted to the CPU 91.

The pattern forming program 97 is stored in the ROM 92 and is loaded into the RAM 93 through the bus line. FIG. 11 illustrates a state in which the pattern forming program 97 is loaded into the RAM 93.

The CPU 91 executes the pattern forming program 97 loaded into the RAM 93. For example, in the pattern forming device 1, the CPU 91 reads the pattern forming program 97 from the ROM 92 according to the input of the instruction from the input unit 95 by the user and develops the same in a program storing region in the RAM 93 to execute various processes. The CPU 91 temporarily stores various data generated by the various processes in a data storage region formed in the RAM 93.

The pattern forming program 97 executed by the pattern forming device 1 has a module configuration including the SRAF arranging method selecting unit 13, the rule based SRAF arranging unit 14, the interference map forming unit 15, and the model based SRAF arranging unit 16, and they are loaded into a main storage device (RAM 93) to be generated in the main storage device. A result of the process executed using the pattern forming program 97 is output from the output unit to the external device and the like.

Meanwhile, the SRAF arranging method selecting unit 13, the rule based SRAF arranging unit 14, the interference map forming unit 15, and the model based SRAF arranging unit 16, which are the functions of the pattern forming device 1, may be the programs having different configurations or may be the program in which a plurality of functions are combined.

Meanwhile, the pattern forming program 97 executed by the pattern forming device 3 according to the second embodiment has the module configuration including the interference map forming unit 15, the model based SRAF arranging unit 16, the checking unit 31, the SRAF removing unit 32, and the rule based SRAF arranging unit 34, and they are loaded into the main storage device to be generated in the main storage device.

Also, the interference map forming unit 15, the model based SRAF arranging unit 16, the checking unit 31, the SRAF removing unit 32, and the rule based SRAF arranging unit 34, which are the functions of the pattern forming device 3, may be the programs having the different configurations or may be the program in which a plurality of functions are combined.

In this manner, according to the second embodiment, after the rule based SRAF 25r is arranged, the model based SRAF 25m is arranged in the portion in which the rule based SRAF 25r cannot be appropriately arranged, so that the SRAF arrangement, which utilizes both of the advantages of the rule based SRAF 25r and the model based SRAF 25m, becomes possible.

In this manner, according to the first and second embodiments, the rule based SRAF 25r is arranged in the rule based region R and the model based SRAF 25m is arranged in the model based region M, so that it becomes possible to arrange the SRAF in a short time also for the pattern including the layout pattern for which the SRAF arrangement is difficult.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sub-resolution assist feature arranging method comprising:
 selecting a rule-based region within a main pattern defined by pattern data, the rule-based region being a region in which sub-resolution assist features are arranged according to a rule in a rule base;
 selecting a model-based region within the main pattern, the model-based region being a region in which sub-resolution assist features are arranged to a model in a model base;
 arranging a first sub-resolution assist feature by the rule base in the rule-based region as a rule-based sub-resolution assist feature; and
 arranging a second sub-resolution assist feature by the model base in the model-based region as a model-based sub-resolution assist feature,
 wherein a space region between the rule-based region and the model-based region is set to have a predetermined width such that:
  a degree of effect of the rule-based sub-resolution assist feature on a resolution of the main pattern arranged in the model-based region is smaller than a first predetermined value, and a degree of effect of the model-based sub-resolution assist feature on a resolution of the main pattern arranged in the rule-based region is smaller than a second predetermined value.

2. The sub-resolution assist feature arranging method according to claim 1, wherein
the rule-based region and the model-based region are set based on at least one of an exposure condition when forming the main pattern on the substrate, a pattern pitch of the main pattern, a pattern shape of the main pattern, pattern dimension of the main pattern, and a mask constraint when fabricating a mask.

3. The sub-resolution assist feature arranging method according to claim 1, wherein
when arranging the model-based sub-resolution assist feature,
distribution information regarding distribution of a degree of effect given to resolution performance of the main pattern when arranging a predetermined pattern around the main pattern is formed for a predetermined pattern region corresponding to the model-based region, and
the model-based sub-resolution assist feature is arranged in the model-based region based on the distribution information.

4. The sub-resolution assist feature arranging method according to claim 1, wherein
when arranging the rule-based sub-resolution assist feature and the model-based sub-resolution assist feature,
the model-based sub-resolution assist feature is arranged after the rule-based sub-resolution assist feature is arranged.

5. The sub-resolution assist feature arranging method according to claim 1, comprising:
checking whether arrangement of the rule-based sub-resolution assist feature and the model-based sub-resolution assist feature is appropriate after arranging the rule-based sub-resolution assist feature and the model-based sub-resolution assist feature; and
arranging again the rule-based sub-resolution assist feature or the model-based sub-resolution assist feature judged to be inappropriately arranged by the check.

6. The sub-resolution assist feature arranging method according to claim 5, wherein
the rule-based sub-resolution assist feature is arranged again by a changed rule base after the rule of the rule base is changed in the pattern region in which the rule-based sub-resolution assist feature or the model-based sub-resolution assist feature judged to be inappropriately arranged by the check is arranged.

7. The sub-resolution assist feature arranging method according to claim 5, wherein
the model-based sub-resolution assist feature is arranged again in the pattern region in which the rule-based sub-resolution assist feature or the model-based sub-resolution assist feature judged to be inappropriately arranged by the check is arranged based on distribution information newly formed after a forming condition used when forming the distribution information is changed.

8. The sub-resolution assist feature arranging method according to claim 5, wherein
out of the rule-based sub-resolution assist feature or the model-based sub-resolution assist feature judged to be inappropriately arranged by the check, the pattern of which distance from the rule-based sub-resolution assist feature or the model-based sub-resolution assist feature other than the same is smaller than a predetermined value is combined or deleted and arranged again.

9. The sub-resolution assist feature arranging method according to claim 5, wherein
the rule-based sub-resolution assist feature or the model-based sub-resolution assist feature judged to be inappropriately arranged by the check is decreased in a pattern size and arranged again.

10. The sub-resolution assist feature arranging method according to claim 5, wherein
when the rule-based sub-resolution assist feature or the model-based sub-resolution assist feature is judged to be inappropriately arranged by the check,
the pattern is arranged again in the rule-based region or the model-based region after change after the rule-based region and the model-based region are changed.

11. The sub-resolution assist feature arranging method according to claim 1, comprising:
when arranging the rule-based sub-resolution assist feature and the model-based sub-resolution assist feature,
arranging the rule-based sub-resolution assist feature;
checking whether arrangement of the rule-based sub-resolution assist feature is appropriate after arranging the rule-based sub-resolution assist feature; and
deleting the rule-based sub-resolution assist feature judged to be inappropriately arranged by the check and arranging the model-based sub-resolution assist feature in a pattern region in which the rule-based sub-resolution assist feature is deleted and in a pattern region in which the rule-based sub-resolution assist feature is not arranged on an appropriate position by the check.

12. The sub-resolution assist feature arranging method according to claim 11, wherein
the pattern region in which the rule-based sub-resolution assist feature is deleted and the pattern region in which the rule-based sub-resolution assist feature is not arranged on the appropriate position by the check are extracted based on at least one of area density of the sub-resolution assist feature included in the pattern region and a lithography compliance check to judge whether the main pattern having desired dimension may be formed when exposed by a predetermined exposure condition.

13. A computer program product including a computer-readable recording medium including a plurality of instructions for arranging sub-resolution assist features, the instructions, when executed by a computer, cause the computer to:
select a rule-based region within a main pattern defined by pattern data, the rule-based region being a region in which sub-resolution assist features are arranged according to a rule in a rule base;
selecting a model-based region within the main pattern, the model-based region being a region in which sub-resolution assist features are arranged to a model in a model base;
arrange a first sub-resolution assist feature by the rule base in the rule-based region as a rule-based sub-resolution assist feature; and
arrange a second sub-resolution assist feature by the model base in the model-based region as a model-based sub-resolution assist feature,
wherein a space region between the rule-based region and the model-based region is set to have a predetermined width such that:

a degree of effect of the rule-based sub-resolution assist feature on a resolution of the main pattern arranged in the model-based region is smaller than a first predetermined value, and a degree of effect of the model-based sub-resolution assist feature on a resolution of the main pattern arranged in the rule-based region is smaller than a second predetermined value.

14. The computer program product according to claim 13, wherein the rule-based region and the model-based region are set based on at least one of an exposure condition when forming the main pattern on the substrate, a pattern pitch of the main pattern, a pattern shape of the main pattern, pattern dimension of the main pattern, and a mask constraint when fabricating a mask.

15. The computer program product according to claim 13, wherein when arranging the model-based sub-resolution assist feature, distribution information regarding distribution of a degree of effect given to resolution performance of the main pattern when arranging a predetermined pattern around the main pattern is formed for a predetermined pattern region corresponding to the model-based region, and the model-based sub-resolution assist feature is arranged in the model-based region based on the distribution information.

16. The computer program product according to claim 13, comprising:

when arranging the rule-based sub-resolution assist feature and the model-based sub-resolution assist feature, arranging the rule-based sub-resolution assist feature;

checking whether arrangement of the rule-based sub-resolution assist feature is appropriate after arranging the rule-based sub-resolution assist feature; and deleting the rule-based sub-resolution assist feature judged to be inappropriately arranged by the check and arranging the model-based sub-resolution assist feature in a pattern region in which the rule-based sub-resolution assist feature is deleted and in a pattern region in which the rule-based sub-resolution assist feature is not arranged on an appropriate position by the check.

17. The computer program product according to claim 16, wherein the pattern region in which the rule-based sub-resolution assist feature is deleted and the pattern region in which the rule-based sub-resolution assist feature is not arranged on the appropriate position by the check are extracted based on at least one of area density of the sub-resolution assist feature included in the pattern region and a lithography compliance check to judge whether the main pattern having desired dimension may be formed when exposed by a predetermined exposure condition.

18. A manufacturing method of a semiconductor device, comprising:

selecting a rule-based region within a main pattern defined by pattern data, the rule-based region being a region in which sub-resolution assist features are arranged according to a rule in a rule base;

selecting a model-based region within the main pattern, the model-based region being a region in which sub-resolution assist features are arranged to a model in a model base;

arranging a first sub-resolution assist feature by the rule base in the rule-based region as a rule-based sub-resolution assist feature; and arranging a second sub-resolution assist feature by the model base in the model-based region as a model-based sub-resolution assist feature;

performing optical proximity correction to the pattern data, in which the rule based sub-resolution assist feature and the model based sub-resolution assist feature are arranged, to form mask data;

fabricating a mask using the mask data; and forming the main pattern on the substrate using the mask, wherein a space region between the rule-based region and the model-based region is set to have a predetermined width such that:

a degree of effect of the rule-based sub-resolution assist feature on a resolution of the main pattern arranged in the model-based region is smaller than a first predetermined value, and a degree of effect of the model-based sub-resolution assist feature on a resolution of the main pattern arranged in the rule-based region is smaller than a second predetermined value.

* * * * *